United States Patent
Akagawa et al.

(10) Patent No.: US 6,667,664 B2
(45) Date of Patent: Dec. 23, 2003

(54) CONTAINER FOR OSCILLATION CIRCUIT USING PIEZOELECTRIC VIBRATOR, MANUFACTURING METHOD THEREFOR, AND OSCILLATOR

(75) Inventors: Hiroaki Akagawa, Tokyo (JP); Hirokazu Kobayashi, Tokyo (JP)

(73) Assignee: Kinseki Limited, Tokyo (JP)

( * ) Notice: Subject to any disclaimer, the term of this patent is extended or adjusted under 35 U.S.C. 154(b) by 163 days.

(21) Appl. No.: 09/806,189

(22) PCT Filed: Jan. 29, 2001

(86) PCT No.: PCT/JP01/00567
§ 371 (c)(1),
(2), (4) Date: Jul. 12, 2001

(65) Prior Publication Data
US 2002/0135429 A1 Sep. 26, 2002

(30) Foreign Application Priority Data

| Jan. 31, 2000 | (JP) | 2000-022512 |
| Feb. 29, 2000 | (JP) | 2000-054299 |
| Mar. 31, 2000 | (JP) | 2000-097764 |
| Apr. 28, 2000 | (JP) | 2000-128784 |
| Jul. 27, 2000 | (JP) | 2000-226531 |

(51) Int. Cl.[7] .............................. H03B 1/00

(52) U.S. Cl. .................... 331/68; 331/66; 331/108 D; 331/158; 257/698; 257/700

(58) Field of Search ............... 331/68, 108 D, 331/158, 66, 69, 70; 257/698, 700; 310/315

(56) References Cited

U.S. PATENT DOCUMENTS

| 5,500,628 A | * | 3/1996 | Knecht ................... 310/348 |
| 6,229,404 B1 | * | 5/2001 | Hatanaka ................ 257/698 |
| 6,410,415 B1 | * | 6/2002 | Estes et al. ............. 257/778 |

FOREIGN PATENT DOCUMENTS

| JP | 8-204452 | 8/1996 |
| JP | 9-167918 | 6/1997 |

* cited by examiner

Primary Examiner—Robert Pascal
Assistant Examiner—Kimberly E Glenn
(74) Attorney, Agent, or Firm—Blakely, Sokoloff, Taylor & Zafman

(57) ABSTRACT

In a hermetically sealed container constituted by a lid (105), frame (103), and substrate (104), a piezoelectric vibrator (101) is fixed on the substrate (104) (on the upper surface of the substrate) with fixing members (104*a*) made of a conductive material, and a semiconductor component (102) is flip-chip mounted on the lower surface of the substrate (104).

38 Claims, 11 Drawing Sheets

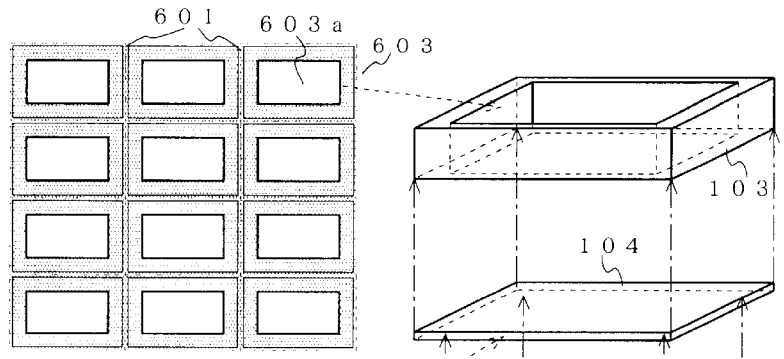
FIG.6A
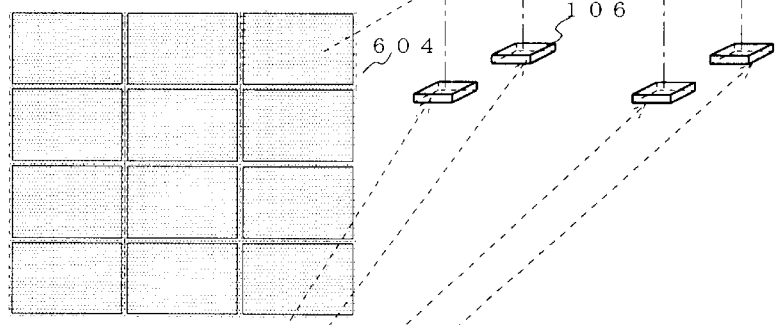
FIG.6B
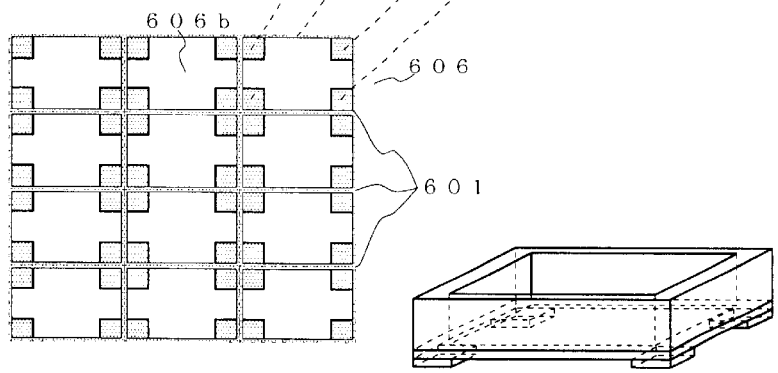
FIG.6D
FIG.6C

CONTAINER FOR OSCILLATION CIRCUIT USING PIEZOELECTRIC VIBRATOR, MANUFACTURING METHOD THEREFOR, AND OSCILLATOR

TECHNICAL FIELD

The present invention relates to an oscillator which can make compact a temperature-compensated oscillator particularly used in the field of mobile communications by, e.g., a radio communication device or portable telephone, a manufacturing method therefor, and an oscillator.

BACKGROUND ART

Quartz oscillators each using, e.g., quartz crystal as a piezoelectric vibrator (piezoelectric component) are widely utilized in the field of data communications, information processing, and the like. Particularly, a potable terminal such as a portable telephone requires a frequency stability in a wide temperature range and a stability exceeding the obtained frequency to temperature characteristics.

Regarding this, a piezoelectric vibrator comprised of, e.g., quartz crystal, has temperature characteristics in that its frequency changes according to the ambient temperature. As an example of this, it is widely known that an AT-cut quartz vibrator has specific temperature characteristics in that the frequency varies largely in the high and low temperature sides with respect to a temperature near 25° C. where the difference from the center frequency is the smallest. Therefore, in order to obtain the required characteristics described above, a temperature compensation circuit is generally added to a quartz oscillator so that stable operation can be obtained.

One temperature-compensated oscillator added with such a temperature compensation circuit has a container structure in which, as shown in, e.g., Japanese Patent Laid-Open Nos. 8-204452 and 9-167918, a container accommodating an oscillation circuit and a container accommodating a piezoelectric vibrator such as a quartz vibrator are integrally formed on the upper and lower sides of a substrate. As shown in FIG. 13a, an oscillator 1301 with this temperature compensation function has a container 1305 in which an accommodating portion 1305a for a piezoelectric vibrator 1302 and an accommodating portion 1305b for an electronic component 1303 constituting an oscillation circuit or the like are integrally formed in its upper and lower sides.

Although not shown, a predetermined circuit interconnection is formed on the bottom surface of the accommodating portion 1305a of the container 1305, and the piezoelectric vibrator 1302 is fixed to a predetermined portion of this circuit interconnection with a conductive adhesive or the like. In addition, a lid 1306a hermetically seals the interior of the accommodating portion 1305a.

A predetermined circuit interconnection (not shown) is formed also on the bottom surface of the accommodating portion 1305b of the container 1305, and the electronic component 1303 is mounted at a predetermined portion of this circuit interconnection. A lid may be provided also to the accommodating portion 1305b of the electronic component 1303 in order to seal this region. Alternatively, a filler 1303a formed of a synthetic resin may fill the accommodating portion 1305b so that it covers and protects the electronic component 1303. In a temperature compensation type quartz oscillator shown in Japanese Patent Laid-Open No. 9-167918, an electronic component adjusting hole is formed in the lid of a container for the electronic component. The electronic component can be adjusted after a quartz oscillator is assembled and completed as well.

Also, another temperature-compensated oscillator has a container structure in which a container on which a substrate having an oscillation circuit is mounted and a container accommodating a piezoelectric vibrator are stacked on each other. As shown in FIG. 14, in an oscillator 1321 with this temperature compensation function, a container 1322 accommodating a piezoelectric vibrator and a container 1324 mounted with an electronic component 1323 constituting an oscillation circuit or the like are stacked on each other. The container 1324 has a recess. A predetermined circuit interconnection is formed at the bottom of this recess, and the electronic component 1323 is mounted at a predetermined portion of this circuit interconnection. A terminal of the circuit interconnection extends onto a bank surrounding the recess of the container 1324, so that it is electrically connected to the piezoelectric vibrator in the container 1322.

A portable terminal such as a portable telephone as described above requires downsizing and cost reduction as well as the frequency stability in a wide temperature range. Regarding these requirements, since the temperature-compensated oscillator with the arrangement of FIG. 13 needs a container for accommodating a piezoelectric vibrator and a container for accommodating an electronic component, it is difficult to downsize.

Since the temperature-compensated oscillator has an integral structure, if a trouble occurs in either one of the piezoelectric vibrator and electronic component, the entire temperature-compensated oscillator becomes defective. For this reason, even if no trouble occurs in the electronic component, since the piezoelectric vibrator is defective, the non-defective electronic component is treated as a defective one.

As shown in FIG. 13b, conventionally, sometimes the filler 1303a charged to fix the electronic component 1303 is attracted to the inner wall of the accommodating portion 1305b so it cannot completely cover the electronic component 1303. As described above, the conventional arrangement leads to a decrease in manufacturing yield and leads to an increase in product cost.

The present invention has been made to solve the above problems, and has as its object to downsize an oscillator to become smaller than a conventional one and to manufacture an oscillator at a lower cost than in the conventional case.

DISCLOSURE OF INVENTION

According to the present invention, in a container for an oscillation circuit which accommodates a piezoelectric vibrator, an oscillator comprises an electrode structure, that can be electrically connected, on the other surface of a multilayered substrate where a piezoelectric component is to be mounted, which opposes a side where the piezoelectric component is mounted, the electrode structure having a sufficient thickness.

According to the present invention, when the container for the oscillation circuit is mounted on another substrate through the electrode structure, a space is defined by the electrode structure between another substrate and the container for the oscillation circuit.

According to another embodiment of the present invention, in a container for an oscillator comprised of a piezoelectric vibrator and a plurality of semiconductor components, there is provided an oscillator in which the semiconductor components are mounted on the other surface of a multilayered substrate where the piezoelectric vibrator is to be mounted, which opposes a side where the piezoelectric component is mounted, a surface where the piezoelectric vibrator is mounted has a recessed structure, and the surface where the semiconductor components are mounted has an electrode structure that can be electrically connected to an external circuit mounting substrate when mounted thereon, the electrode structure having a thickness slightly larger than those of the semiconductor components.

According to the present invention, when the container for the oscillation circuit is mounted on another substrate through the electrode structure, the semiconductor component is placed in a space defined by the electrode structure between another substrate and the container for the oscillation circuit.

According to the present invention, in an oscillator comprised of a piezoelectric vibrator and a plurality of semiconductor components, the semiconductor components are mounted on the other surface of a multilayered substrate, where the piezoelectric vibrator is to be mounted, which opposes a side where the piezoelectric component is to be mounted, a surface where the piezoelectric vibrator is mounted has a recessed structure, and the surface where the semiconductor components are mounted has an electrode structure that can be electrically connected to an external circuit mounting substrate when mounted thereon, the electrode structure having a thickness slightly larger than those of the semiconductor components.

According to the present invention, when the oscillator is mounted on another substrate through the electrode structure, the semiconductor component is placed in a space defined by the electrode structure between another substrate and the container for the oscillation circuit.

According to embodiment of the present invention, in an oscillator comprised of a piezoelectric vibrator and an electronic component, a substrate on which the electronic component is mounted is adhered to a bottom surface of the piezoelectric vibrator and is integrated therewith, and a conduction electrode which electrically connects the piezoelectric vibrator and the substrate where the electronic component is to be mounted constitutes an oscillator.

According to the present invention, when the oscillator is mounted on another substrate through the electrode structure, the semiconductor component is placed in a space defined by the electrode structure between another substrate and the container for the oscillation circuit.

In the present invention, the electronic component is arranged on the substrate which is in contact with the bottom surface of the piezoelectric vibrator.

In an oscillator according to still another embodiment of the present invention and comprised of a piezoelectric vibrator and an electronic component, a substrate on which the electronic component is mounted is arranged on a bottom surface of the piezoelectric vibrator, and the piezoelectric vibrator and the substrate are integrated through a conduction electrode that electrically connects the piezoelectric vibrator and the substrate to each other, thereby forming an oscillator.

According to the present invention, the electronic component is arranged between the substrate and the bottom surface of the piezoelectric vibrator.

According to the present invention, the electronic component is arranged on a surface of a circuit substrate where the oscillator is to be mounted.

According to still another embodiment of the present invention, in a laminated container comprised of at least two multilevel structure substrates, in which at least one of multilevel laminated substrates with recesses, on an upper and lower surfaces thereof, at portions where an electronic component and a piezoelectric component are to be mounted, employs an annular laminated substrate, the annular laminated substrate is in contact with at least one flat laminated substrate which constitutes the laminated container, and one layer which opposes the flat laminated substrate in contact therewith is the annular laminated substrate, there is provided an oscillator, wherein portions corresponding to vertical and horizontal sizes of an inner wall of the recess constituting the laminated container and a portion corresponding to a vertical size of an inner wall of the other annular recess are located on the same line by not less than 60%.

According to still another embodiment of the present invention, in a laminated container is comprised of at least two multilevel laminated substrates, in which one of the multilevel laminated substrates employs an annular laminated substrate so as to form a recess at a portion thereof where an electronic component and a piezoelectric component are to be mounted, the annular laminated substrate is in contact with at least one flat laminated substrate constituting the laminated container, and at least one layer which is in contact with the flat laminated structure is a laminated substrate with pedestal portions arranged at corners thereof, there is provided an oscillator, wherein vertical and horizontal sizes of four corners of an inner wall of the annular recess constituting the laminated container and an inner size of each corner portion of the other pedestal portion of the flat laminated substrate are located on the same line.

According to an oscillator manufacturing method of the present invention, there is provided a method of manufacturing a container for a surface-mounted oscillation circuit, comprising, in order to form a pedestal portion with a sufficiently large thickness on the other surface of a substrate where a piezoelectric component is to be mounted, which opposes a side where the piezoelectric component is mounted, the steps of arranging a positioning plate, fitting a conductive pedestal portion in the positioning plate, and integrating and heating the substrate, the positioning plate, and the conductive pedestal portion.

According to a piezoelectric component manufacturing method of the present invention, there is provided a method of manufacturing a container for a surface-mounted oscillation circuit, comprising, in order to form a pedestal portion with a sufficiently large thickness on a surface of a substrate where a piezoelectric component is to be mounted, which opposes a side where the piezoelectric component is mounted, the steps of arranging a conductive pedestal portion mask, printing a conductive pedestal portion through the conductive pedestal portion mask, and heating the conductive pedestal portion.

According to the present invention, an electronic component is mounted on that surface of the container for an oscillation circuit which opposes a surface where the piezoelectric component is mounted, thereby forming an oscillator.

According to still another embodiment of the present invention, an oscillator comprises a hermetically sealable container arranged on a major surface of a substrate and adapted to accommodate a piezoelectric vibrator, and a plurality of electrode structures arranged on a lower surface of the substrate and higher than a semiconductor component to be flip-chip mounted on the lower surface of the substrate, wherein the piezoelectric vibrator, the semiconductor component, and the electrode structures constitute an oscillation circuit.

According to the present invention, the plurality of electrode structures serve as columns for forming a heat dissipation space around the semiconductor component which is flip-chip mounted. The semiconductor component does not come into contact with another member with which the distal ends of the electrode structures come into contact.

In the present invention described above, the container may be constituted by a frame formed on the major surface of the substrate and a lid formed on the frame, or by a recess formed in the major surface of the substrate and a lid covering the recess. Also, the substrate may have a multilayered interconnection structure.

In the present invention, the substrate may be formed of a first substrate where the container is to be formed, and a second substrate where the semiconductor component is mounted. The semiconductor component performs temperature compensation of an oscillation frequency obtained by the piezoelectric vibrator.

According to still another embodiment of the present invention, there is provided an oscillator comprising a piezoelectric vibrator arranged on a major surface of a substrate to be disconnected from an outer air, a semiconductor substrate flip-chip mounted on a lower surface of the substrate, and a plurality of electrode structures arranged on the lower surface of the substrate and higher than the semiconductor component, wherein the piezoelectric vibrator, the semiconductor component, and the electrode structures constitute an oscillation circuit.

According to the present invention, the plurality of electrode structures serve as columns for forming a heat dissipation space around the semiconductor component which is flip-chip mounted. The semiconductor component does not come into contact with another member with which the distal ends of the electrode structures come into contact.

According to the present invention, the container may be constituted by a frame formed on the major surface of the substrate and a lid formed on the frame, or by a recess formed on the major surface of the substrate and a lid covering the recess. The substrate may have a multilayered interconnection structure.

According to the present invention, the substrate may be formed of a first substrate where the container is to be formed, and a second substrate where the semiconductor component is mounted. The semiconductor component performs temperature compensation of an oscillation frequency obtained by the piezoelectric vibrator.

A container for an oscillation circuit using a piezoelectric vibrator according to the present invention comprises a hermetically sealable container arranged on a major surface of a substrate and adapted to accommodate a piezoelectric vibrator, and a frame stacked on a lower surface of the substrate and higher than a semiconductor component to be flip-chip mounted on the lower surface of the substrate, wherein a shift amount between the substrate and the frame in a widthwise direction of the frame is less than 40% a width of the frame, and the piezoelectric vibrator, the semiconductor component, and the electrode structure constitute an oscillation circuit.

A container for an oscillation circuit using a piezoelectric vibrator according to the present invention comprises a hermetically sealable container arranged on a major surface of a substrate and adapted to accommodate a piezoelectric vibrator, and four pedestal portions arranged in contact with four corners of a lower surface of the substrate and higher than a semiconductor component to be flip-chip mounted on the lower surface of the substrate, wherein a shift amount between the substrate and the frame in a widthwise direction of the frame is less than 40% a width of the frame, positions of four sides of a rectangle inscribed to the four pedestal portions overlap positions where four inner sides of the frame are projected toward the substrate, and the piezoelectric vibrator, the semiconductor component, and the electrode structure constitute an oscillation circuit.

A container for an oscillation circuit using a piezoelectric vibrator according to the present invention comprises a hermetically sealable container arranged on a major surface of a substrate and adapted to accommodate a piezoelectric vibrator, and four pedestal portions arranged in contact with four corners of a lower surface of the substrate and higher than a semiconductor component to be flip-chip mounted on a lower surface of the substrate, wherein a shift amount between the substrate and the frame in a widthwise direction of the frame is less than 40% a width of the frame, positions of four sides of a rectangle inscribed to the four pedestal portions overlap positions where four inner sides of the frame are projected toward the substrate within a region of 2 mm, and the piezoelectric vibrator, the semiconductor component, and the electrode structure constitute an oscillation circuit.

BRIEF DESCRIPTION OF DRAWINGS

FIG. 6 shows views of the steps in still another manufacturing process for the oscillator according to the embodiment of the present invention;

BEST MODE OF CARRYING OUT THE INVENTION

The embodiments of the present invention will be described with reference to the accompanying drawings.

<First Embodiment>

Figure 1A:
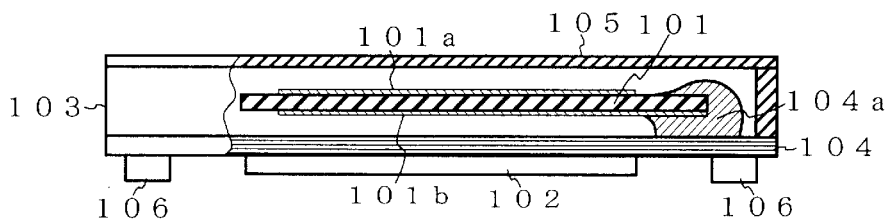
FIG. 1 shows a partial sectional view and plan views of the arrangement of an oscillator formed of a container for an oscillation circuit according to an embodiment of the present invention.
Figure 1B:
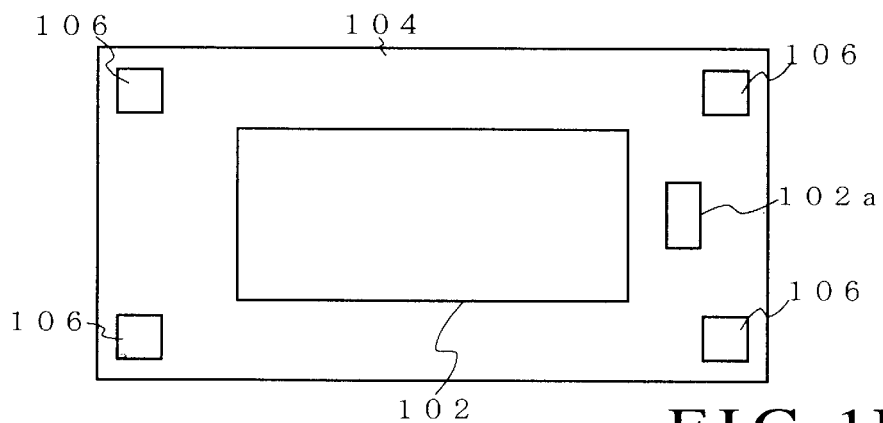
Figure 1C:
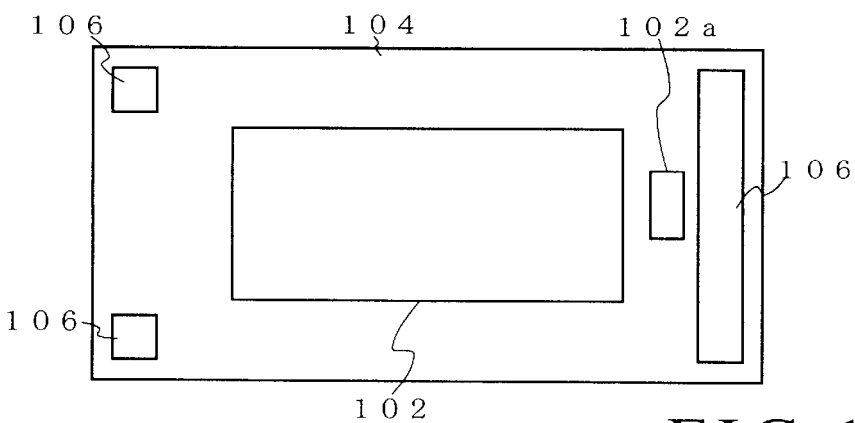

FIG. 1a is a partial sectional view showing the arrangement of an oscillator according to the first embodiment of the present invention, and FIGS. 1b and 1c are plan views of the same. This oscillator has a piezoelectric vibrator 101 serving as a piezoelectric component such as an AT-cut quartz vibrator. The piezoelectric vibrator 101 is fixed on a substrate 104 (on the surface of the substrate 104) with fixing members 104a made of a conductive material.

The fixing members 104a are made of a resin dispersed with a plurality of fine metal particles of Au or the like. As the resin, an epoxy-based resin or silicone-based resin is used. The fixing members 104a support the piezoelectric vibrator 101 with set resin and are electrically connected to electrodes 110a and 101b, formed on the surface of the piezoelectric vibrator 101 in the presence of the dispersed fine metal particles.

The piezoelectric vibrator 101 is placed on the substrate 104 and arranged in a hermetically sealed container constituted by a lid 105, frame 103, and the substrate 104 with, e.g., a multilayered interconnection structure. Since the substrate 104 has the multilayered interconnection structure, it can be formed without exposing its circuit interconnection portion to its upper or lower surface, so that a high reliability in the signal transmission line can be obtained. If the substrate 104 does not require a complicated circuit interconnection, it need not have a multilayered interconnection structure.

The frame 103 and lid 105 may be made of a material such as a ceramic material generally used to form a package for, e.g., a semiconductor component, or a metal material such as an iron-nickel alloy or Kovar, which does not generate gas when heated. To form the substrate 104, for example, a material such as a ceramic material which does not generate gas when heated may be basically used, and a metal interconnection pattern may be formed on the substrate 104.

The frame 103 and substrate 104, and the frame 103 and lid 105 are hermetically sealed with each other. For sealing, for example, a synthetic rubber-based adhesive, glass frit, soldering (brazing), or seaming may be used. As the solder (brazing) material, for example, a generally used eutectic solder or Au-Sn may be used. For example, the fixing members 104a may be formed of a solder or conductive adhesive.

A circuit interconnection (not shown) is formed on the upper surface of the substrate 104, and the fixing members 104a are formed at predetermined portions on the circuit interconnection. The piezoelectric vibrator 101 is connected to the circuit interconnection through the fixing members 104a.

A circuit interconnection (not shown) is formed also on the lower surface of the substrate 104. Predetermined portions of this circuit interconnection and predetermined portions of a semiconductor component (electronic component) 102 are connected to each other, so that the semiconductor component 102 and an electronic component 102a are flip-chip mounted.

Flip-chip mounting is a technique of connecting the semiconductor component 102 as a bear chip LSI to the lower surface of the substrate 104 without using wire bonding. This eliminates a package, thereby accordingly reducing the mounting area.

In this manner, since the semiconductor component 102 is mounted in a bear state without being packaged, the lower surface of the semiconductor substrate constituting the semiconductor component 102 and made of silicon or the like is exposed. In order to protect the exposed surface of the semiconductor substrate, for example, an insulating resin such as polyimide may be applied to the exposed surface of the semiconductor component 102, thereby forming a protective film.

A temperature compensation circuit, a temperature detection circuit, and the like are integrated on the semiconductor component 102 which is flip-chip mounted on the lower surface of the substrate 104 as described above. For example, the electronic component 102a is a chip capacitor or chip resistor. Another integrated circuit chip may be mounted on the lower surface of the substrate 104.

In addition, electrodes (electrode structures) 106 serving as the conductive pedestal portions are formed (arranged) on the lower surface of the substrate 104 such that they are connected to the circuit interconnection formed on the lower surface of the substrate 104. In this embodiment, the electrodes 106 are connected to the circuit substrate, on which an oscillator is to be mounted, with solder or the like. The circuit interconnections on the upper and lower surfaces of the substrate 104 are connected to each other at their predetermined portions through plugs formed in via holes extending through the substrate 104.

Although four electrodes 106 are formed in FIG. 1b, the present invention is not limited to this. It suffices if a total of three electrodes 106, i.e., a power supply terminal for driving the oscillator and two output signal terminals, are formed. To make a voltage variable frequency oscillator, an electrode for applying a control voltage is also required, and accordingly a total of four electrodes are required.

Figure 1D:
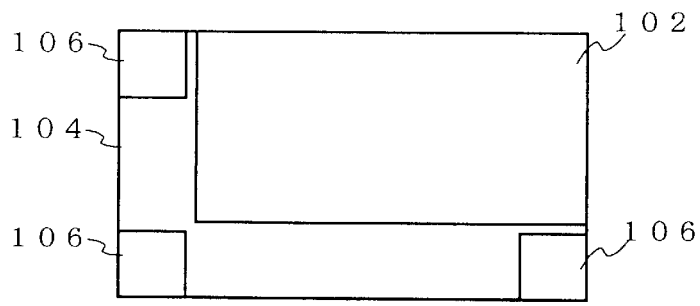

If the number of electrodes 106 is three, these electrodes 106 may be arranged respectively in contact with the three corners of the lower surface of the substrate 104 and the semiconductor component 102 may be arranged in contact with the remaining corner, so the entire oscillator can be made compact (FIG. 1d).

The temperature detection circuit integrated on the semiconductor component 102 detects the ambient temperature and provides temperature information to the temperature compensation circuit integrated on the semiconductor component 102. Based on the temperature information, the temperature compensation circuit appropriately corrects the circuit parameter in accordance with a change in ambient temperature, suppresses variations in frequency of the oscillation output obtained from the piezoelectric vibrator 101 through the circuit interconnections formed on the substrate 104, and outputs the suppressed oscillation output from the electrodes 106.

The electrodes 106 are formed such that their projecting heights from the lower surface of the substrate 104 are larger than the projecting height of the flip-chip mounted semiconductor component 102 from the lower surface of the substrate 104. Since the electrodes 106 are formed to project in this manner, when the oscillator is to be mounted on the circuit substrate, the semiconductor component 102 is prevented from coming into contact with the circuit substrate.

Figure 2A:
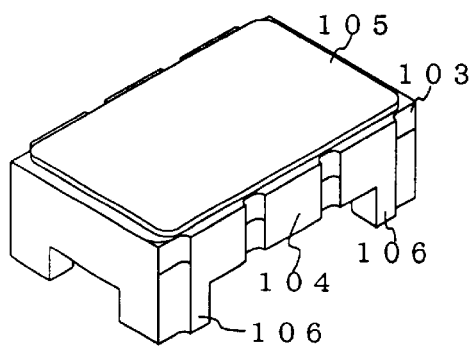
FIG. 2 shows perspective views, plan views, and an equivalent circuit diagram of the arrangement of the oscillator formed of the container for the oscillation circuit according to the embodiment of the present invention.
Figure 2B:
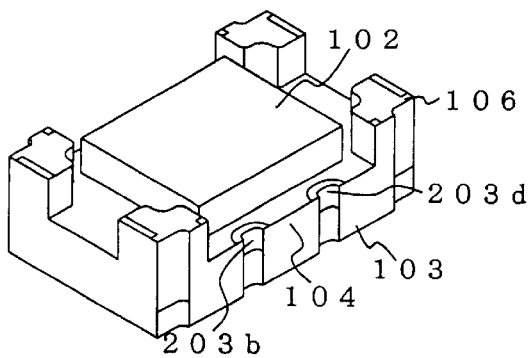
Figure 2C:
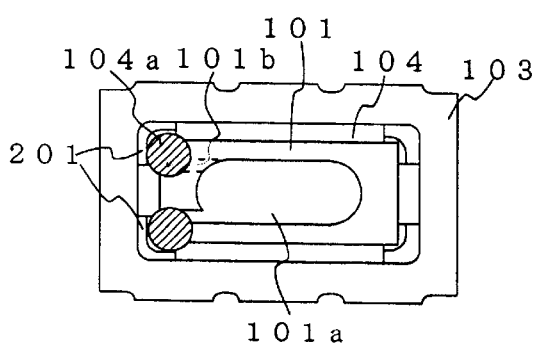
Figure 2D:
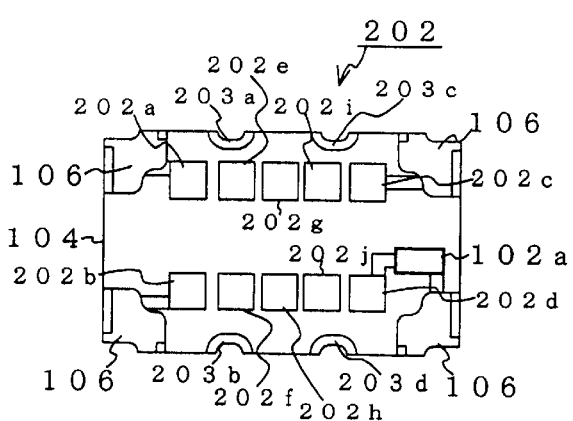

FIGS. 2a and 2b are perspective views showing the oscillator of FIG. 1 in more detail, and FIGS. 2c and 2d are plan views of the same. FIG. 2c is a plan view, seen from above, of the substrate 104 on which the piezoelectric vibrator 101 is arranged, and the frame 103. Electrode pads 201 to be connected to the piezoelectric vibrator are formed at two corners in the accommodating region, where the piezoelectric vibrator 101 is to be accommodated, inside the frame 103. The two corners of the piezoelectric vibrator 101 are fixed to the two electrode pads 201 with the fixing members 104a. For example, the terminal portions of the electrode 101a formed on the surface of the piezoelectric vibrator 101 are connected to the electrode pads 201 through the fixing members 104a.

FIG. 2d is a plan view, seen from the lower surface, of the substrate 104 on which the semiconductor component 102 is not mounted. The four electrodes 106 and a circuit interconnection 202 with ten terminals 202a to 202j are formed on the lower surface of the substrate 104. The respective terminals of the semiconductor component 102 are connected to the terminals 202a to 202j of the circuit interconnection 202. Adjustment terminals 203a to 203d used for final adjustment are formed at the side portions of the substrate 104, and are respectively connected to the terminals 202g to 202j.

The plugs are formed to extend through the substrate 104 from the electrode pads 201, where the piezoelectric vibrator is to be fixed, so as to be connected to predetermined terminals of the circuit interconnection 202. These plugs are connected to the terminals 202g and 202h of the circuit interconnection 202.

Figure 2E:
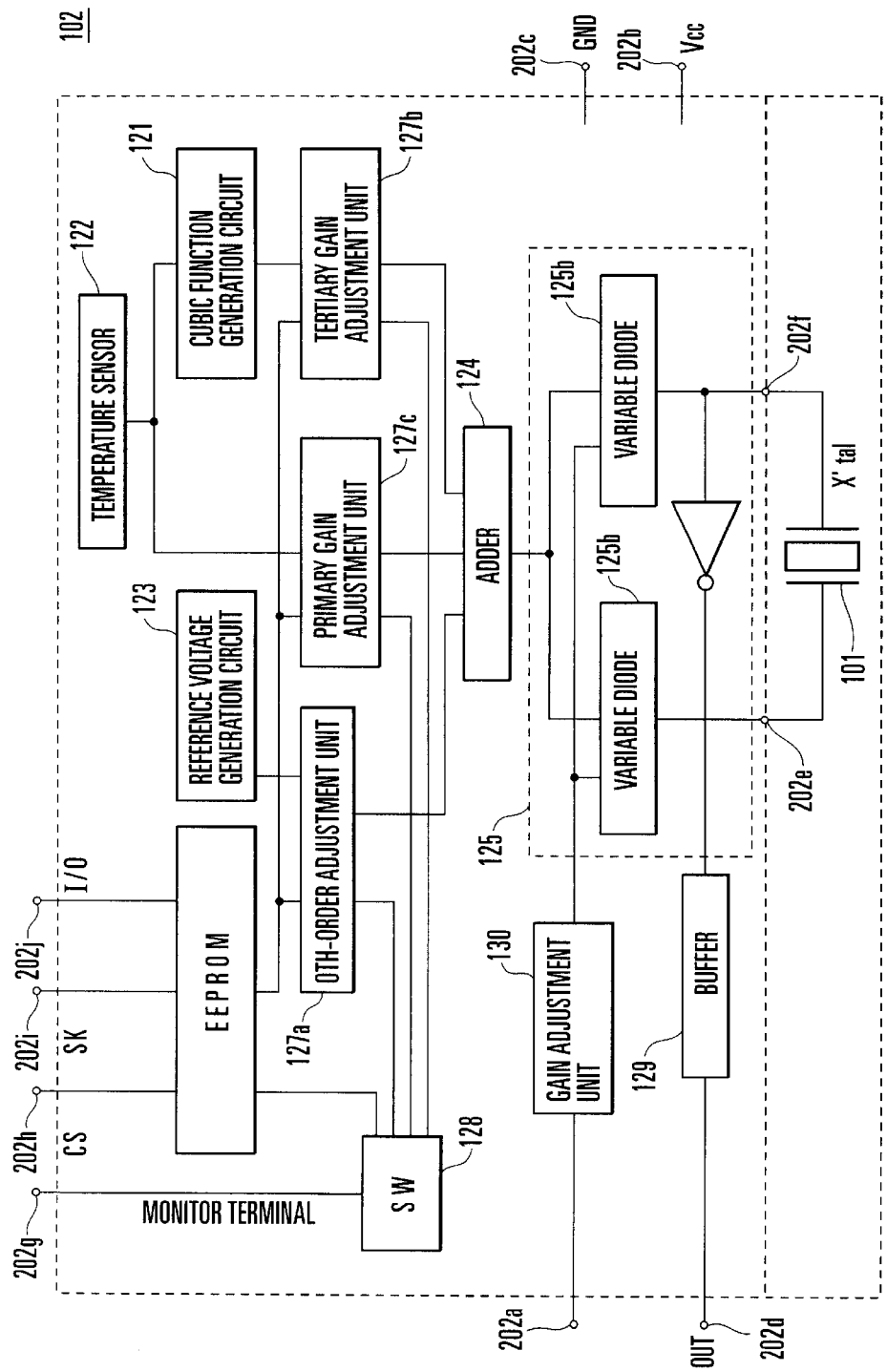

FIG. 2e shows an equivalent circuit obtained when the semiconductor component 102 is flip-chip mounted on the circuit interconnection 202 to form the oscillation circuit. In this case, the substrate 104 need not have a multilayered interconnection structure.

As shown in FIG. 2e, the semiconductor component 102 is connected to the piezoelectric vibrator 101 through the terminals 202e and 202f. In the semiconductor component 102, a cubic function generation circuit 121 generates a correction function obtained by inverting the basic temperature characteristics of the piezoelectric vibrator 101. The cubic function generation circuit 121 receives a signal corresponding to the ambient temperature measured by a temperature sensor 122, and outputs a correction function value corresponding to this signal value as a reference correction value.

The reference correction value and a reference voltage output from a reference voltage generation circuit 123 are added by an adder 124. The voltage obtained by addition is input to an oscillation circuit 125 comprised of variable diodes 125a and 125b, so that variations in the piezoelectric vibrator 101 caused by the ambient temperature are suppressed, and an oscillation signal in which variations caused by the temperature are suppressed is output to an output terminal connected to the terminal 202d. This oscillation signal is output through the terminal 202d and electronic component 102a from the electrode 106 connected to the electronic component 102a.

The piezoelectric vibrator 101 has an individual difference, although small, due to variations in the manufacture. The variations in oscillation signal due to the individual difference are suppressed on the basis of adjustment data stored in a storage (EEPROM) 126 serving as a programmable read-only memory.

As shown in FIG. 2e, the reference voltage output from the reference voltage generation circuit 123 is adjusted by a 0th-order adjustment unit 127a, and the reference correction value output from the cubic function generation circuit 121 is adjusted (amplitude increase/decrease correction) by a tertiary gain adjustment unit 127b. The adjusted reference voltage and reference correction value, and an adjustment signal output from the temperature sensor 122 and adjusted (correction of tilt and rotation) by a primary gain adjustment unit 127c are added by the adder 124. The voltage obtained by addition is input to the oscillation circuit 125, so an oscillation signal, in which variations due to individual difference are also suppressed, is output to the output terminal connected to the terminal 202c.

The adjustment data stored in the storage 126 is input and adjusted by using the adjustment terminals 203a to 203d.

The adjustment terminal 203b is connected to the chip selector (CS) terminal of the storage 126 through the terminal 202h. The adjustment terminal 203c is connected to the system clock (SK) terminal of the storage 126 through the terminal 202i. The adjustment terminal 203d is connected to the input/output (I/O) terminal of the storage 126 through the terminal 202j.

The adjustment data described above is input to the storage 126 through the adjustment terminals 203b to 203d. Signals output from the 0th-order adjustment unit 127a, primary gain adjustment unit 127c, and tertiary gain adjustment unit 127b are monitored by a monitor terminal, i.e., the terminal 202g, while being switched by a switch (SW) 128, thereby checking the consistency of the input adjustment data. The oscillation signal is output through a buffer 129.

If a gain adjustment signal is input to a gain adjustment unit 130 through the terminal 202d, a voltage variable frequency oscillator which changes the frequency of the oscillation signal can be formed. When the oscillation frequency is variable, an electrode for inputting a gain adjustment signal is required, and the oscillator needs four electrodes 106, as shown in FIG. 1b. If the oscillation frequency is fixed, an electrode for inputting a gain adjustment signal is not required, and it suffices if three electrodes are provided, as shown in FIG. 1c. In this case, no gain adjustment unit 130 need be prepared in the semiconductor component 102.

A method of manufacturing an oscillator according to this embodiment will be described.

Figure 3A:
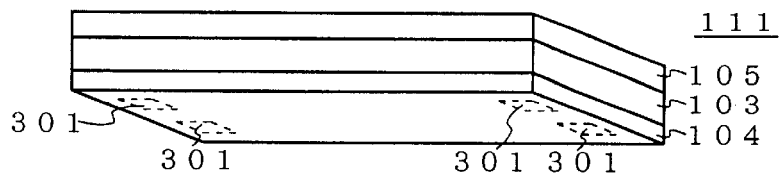
FIG. 3 shows views of the steps in a manufacturing process for the oscillator according to the embodiment of the present invention.

First, as shown in FIG. 1a, the piezoelectric vibrator 101 is fixed on the substrate 104 with the fixing members 104a, the frame 103 is fixed on the substrate 104, and a container constituted by the substrate 104 and frame 103 is sealed by the lid 105, thereby preparing a piezoelectric vibrator unit 111 shown in FIG. 3a.

In the piezoelectric vibrator unit 111, pads 301 made of a conductive material such as a Ag-Pd solder material or copper are formed at electrode connection portions on the circuit interconnection formed on the lower surface of the substrate 104. Although not shown in FIG. 3a, in the container, a circuit interconnection to be connected to the piezoelectric vibrator through the fixing members is formed on the upper surface of the substrate 104.

Figure 3B:
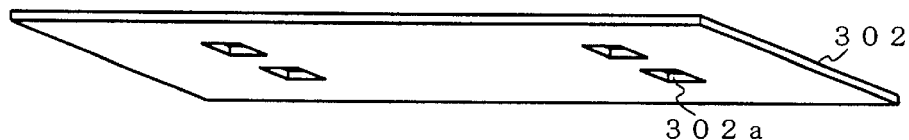

As shown in FIG. 3b, a positioning plate 302 with openings 302a at electrode formation regions is prepared.

Figure 3C:
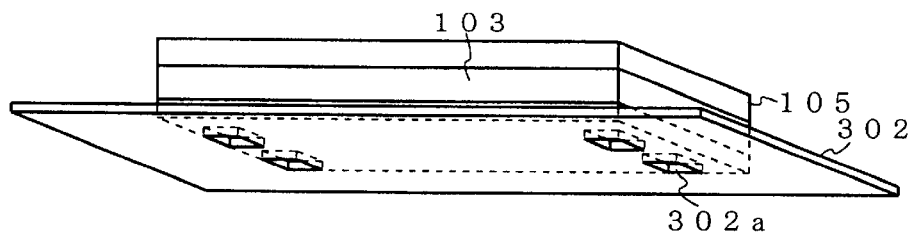

As shown in FIG. 3c, the positioning plate 302 is abutted against and fixed to the predetermined portions of the lower surface of the piezoelectric vibrator unit 111, i.e., the lower surface of the substrate 104. The surfaces of the pads 301 formed on the lower surface of the substrate 104 are exposed to the bottom surfaces of the openings 302a.

Figure 3D:
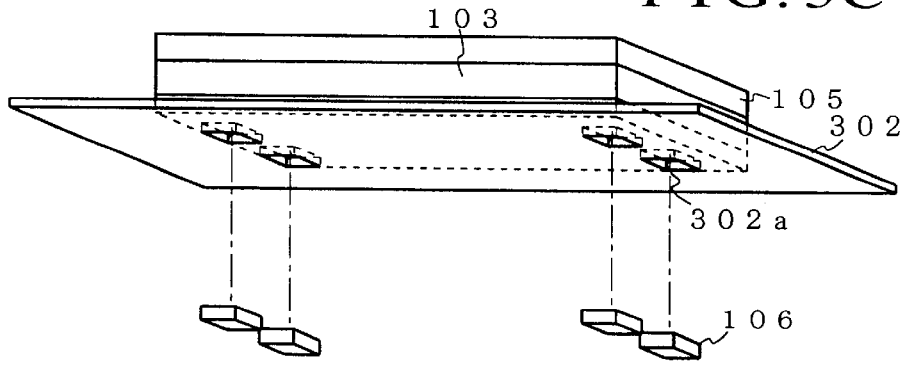

As shown in FIG. 3d, the electrodes 106 are fitted in the openings 302a so they come into contact with the exposed surfaces of the pads 301. The resultant structure is heated to, e.g., 280° C., thereby soldering the electrodes 106 at the electrode connection portions.

Figure 3E:
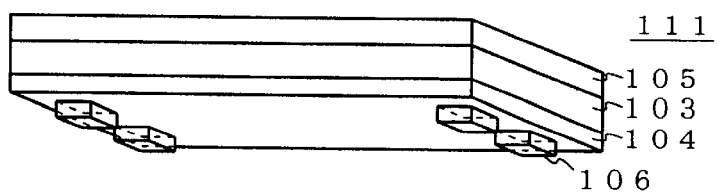

The positioning plate 302 is removed from the substrate 104. Then, a state in which the electrodes 106 are formed on the lower surface of the substrate 104 of the piezoelectric vibrator unit 111 can be obtained, as shown in FIG. 3e. After that, a semiconductor component is flip-chip mounted at a predetermined portion of the circuit interconnection on the lower surface of the substrate, thereby obtaining the oscillator shown in FIG. 1a.

Alternatively, the oscillator of this embodiment can be manufactured in the following manner.

Figure 4A:
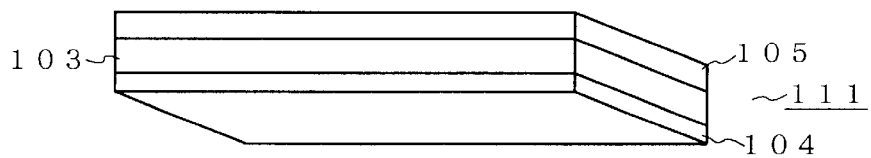
FIG. 4 shows views of the steps in another manufacturing process for the oscillator according to the embodiment of the present invention.

First, as shown in FIG. 1a, a piezoelectric vibrator 101 is fixed on a substrate 104 with fixing members 104a, a frame 103 is fixed on the substrate 104, and a container constituted by the substrate 104 and frame 103 is sealed by a lid 105, thereby preparing a piezoelectric vibrator unit 111 shown in FIG. 4a. This method is identical to the manufacturing method shown in FIGS. 3a to 3e.

Figure 4B:
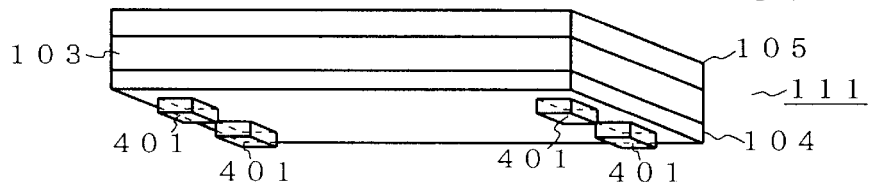

Patterns 401 made of a conductive paste are formed by screen printing at the electrode connection portions of a circuit interconnection formed on the lower surface of the substrate 104 of the piezoelectric vibrator unit 111. Although not shown in FIGS. 4a to 4c, in screen printing, a mask pattern is formed on a screen spread over a frame. The frame is then placed on the lower surface of the substrate 104. The conductive paste serving as the ink is passed through pores in the screen exposed to the openings of the mask pattern, thereby forming the patterns 401.

For example, the conductive paste serving as the ink in screen printing is a printing paste obtained by dispersing metal particles of an Ag-Pd solder material in an organic resin binder.

Figure 4C:
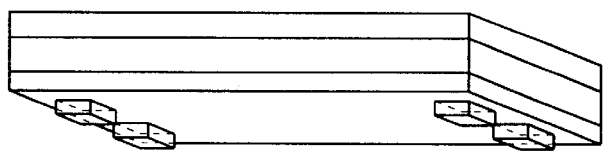

The patterns 401 are then heated and baked, so the organic contents in the patterns 401 are removed. Then, only the metal contents in the patterns 401 are left, so electrodes 106 made of a metal material are formed on the lower surface of the substrate 104, as shown in FIG. 4c.

Alternatively, the oscillator of this embodiment can be manufactured in the following manner.

Figure 5A:
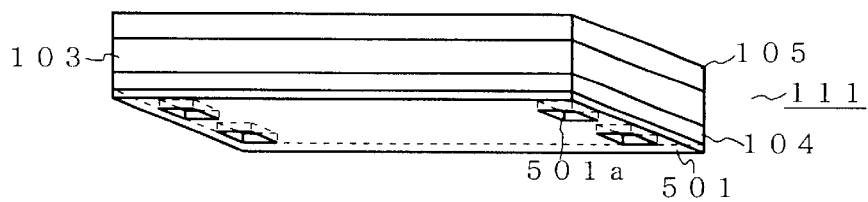
FIG. 5 shows views of the steps in still another manufacturing process for the oscillator according to the embodiment of the present invention.

First, as shown in FIG. 1a, a piezoelectric vibrator 101 is fixed on a substrate 104 with fixing members 104a, a frame 103 is fixed on the substrate 104, and a container constituted by the substrate 104 and frame 103 is sealed by a lid 105, thereby preparing a piezoelectric vibrator unit 111, as shown in FIG. 4a. Subsequently, as shown in FIG. 5a, a mask pattern 501 with openings 501a is formed on the lower surface of the substrate 104. The openings 501a are formed to expose the electrode formation portions of a circuit interconnection formed on the lower surface of the substrate 104. For example, the mask pattern 501 can be formed by applying a photosensitive resist and processing the resist with a known photolithography technique.

Figure 5B:
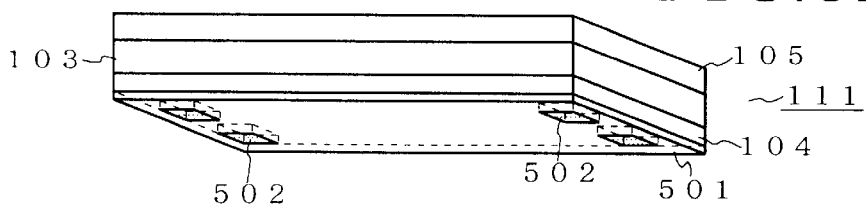
Figure 5C:
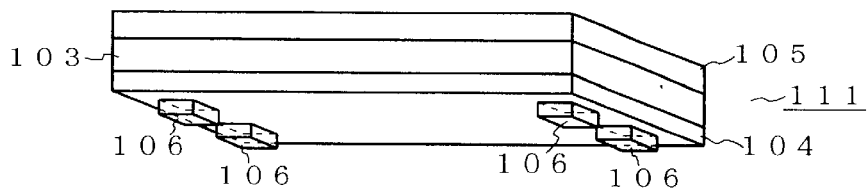

Subsequently, as shown in FIG. 5b, metal films 502 are selectively formed by, e.g., plating, on electrode formation regions exposed within the openings 501a of the mask pattern 501. After that, as shown in FIG. 5c, the mask pattern 501 is removed, so electrodes 106 made of a metal material are formed on the lower surface of the substrate 104.

Of the oscillator according to this embodiment, particularly a portion constituted by the substrate 104, frame 103, and electrodes (electrode structures) 106 may be manufactured in the following manner.

First, as shown in FIG. 6a, a plurality of openings 603a are formed in a matrix with a predetermined pitch on a ceramic plate 603 with a thickness equal to the height of the frame 103. The openings 603a are rectangular when seen from above. The ceramic plate 603 is cut and separated along a plurality of cutting regions 601 arranged in the vertical and horizontal directions at a pitch equal to the formation pitch of the openings 603a, thereby forming the frame 103.

As shown in FIG. 6b, a ceramic plate 604 with a thickness equal to that of the substrate 104 is prepared. For example, structures, electrode pads, and circuit interconnections as shown in FIGS. 2c and 2d are formed on the ceramic plate 604 in advance in a matrix with the pitch equal to the formation pitch of the openings 603a.

In addition, as shown in FIG. 6c, a plate 606 with a thickness equal to the heights of the electrodes 106 is prepared, and a plurality of openings 606a are formed in the plate 606 in a matrix with a pitch equal to that of the openings 603a. The shape of each opening 606a is like the one obtained by folding the four corners of a rectangle. The plate 606 is cut and separated along a plurality of cutting regions 601 arranged in the vertical and horizontal directions at a pitch equal to the formation pitch of the openings 606a, thereby forming a plurality of electrodes 106. The plate 606 can be, e.g., a ceramic plate. In this case, after the openings 603a are formed, the surface of the plate 606 is metallized to form metal films, so the metal films can serve as electrodes.

In the ceramic plates 603 and 604 and the plate 606, the cutting regions 601 are arranged at the same pitch in the vertical and horizontal directions. Therefore, when the ceramic plates 603 and 604 are cut and separated along the corresponding cutting regions 601, the resultant frame portions and plate portions have the same outer sizes when seen from above.

The above ceramic plates 603 and 604 and the plate 606 are aligned with each other and adhered. The resultant plate assembly is cut and separated along the cutting regions 601, so container structures shown in FIG. 6d can be obtained.

As described above, in the oscillator according to this embodiment, the piezoelectric vibrator 101 is fixed to one surface of the substrate 104, and the semiconductor component 102 for performing temperature compensation is directly mounted on the other surface of the substrate 104. On one surface of the substrate 104, the piezoelectric vibrator 101 is covered with the sealed container constituted by the frame 103 and lid 105, so it is protected from the outer air. In addition, the electrodes 106 define a space between the substrate 104 and a circuit mounting substrate on which this oscillator is to be mounted, so the semiconductor component 102 exposed to the lower surface of the substrate 104 will not come into contact with the circuit mounting substrate.

Figure 7:
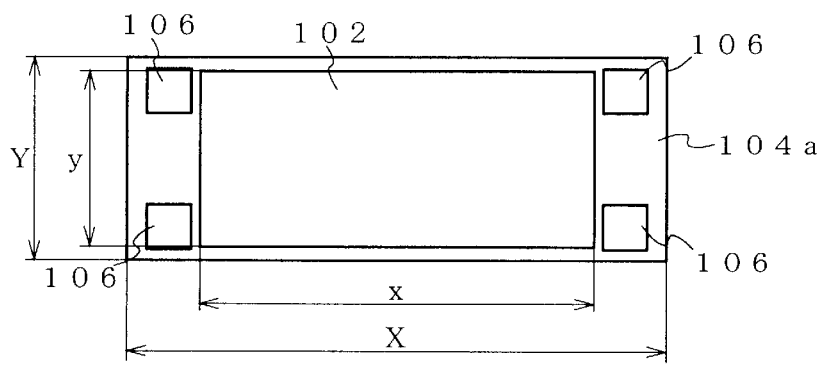
FIG. 7 is a plan view showing the arrangement of the container for the oscillation circuit according to the embodiment of the present invention.

As a result, according to this embodiment, the side where the semiconductor component 102 is to be mounted does not have a container structure, unlike the side where the piezoelectric vibrator 101 is to be mounted, and does not have a wall. Accordingly, the size of the substrate 104 suffices if it is approximately equal to the sum of the mounting area of the semiconductor component 102 and the area where the electrodes 106 are to be formed, and can be greatly reduced than in the prior art. For example, as shown in FIG. 7, the relationship between the area (X×Y) of the substrate which is calculated from a vertical size Y and horizontal size X, and the area (x×y) of the semiconductor component which is calculated from a vertical size y and horizontal size x can be set such that a ratio ((x×y)/(X×Y)) of the respective areas is larger than 40%.

Alternatively, before sealing with the lid 105 is performed, the piezoelectric vibrator 101 may be mounted within the frame 103 on the upper surface of the substrate 104, and adjustment may be performed so desired frequency characteristics can be obtained. After that, the lid 105 may be fixed on the frame 103 to seal it, and the semiconductor component 102 may be mounted on the lower surface of the substrate 104. In this case, several piezoelectric vibrators and semiconductor components 102 may be manufactured separately, and among them only non-defective ones may be combined to form one oscillator. As a result, the manufacturing cost of the oscillator can be suppressed greatly.

Figure 8:
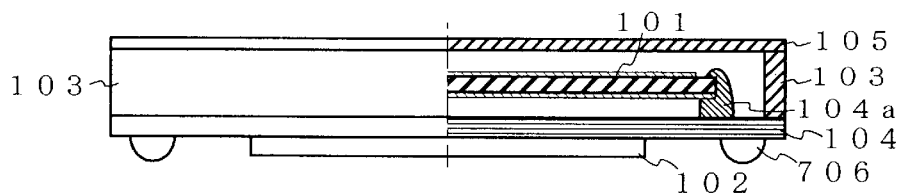
FIG. 8 is a partial sectional view showing an arrangement of an oscillator formed of a container for an oscillation circuit according to another embodiment of the present invention.

Although the rectangular electrodes 106 are used in the above embodiment, the present invention is not limited to this. As shown in FIG. 8, semispherical swelling bumps 706 made of a conductive material such as a metal may be employed in place of the electrodes 106. The heights of the bumps 706 suffice if they are about 0.2 mm to 0.7 mm.

Figure 9:
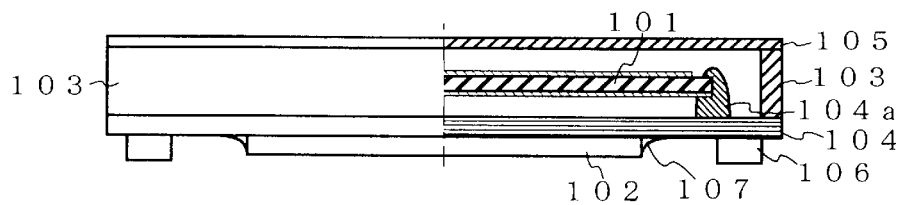
FIG. 9 is a partial sectional view showing an arrangement of an oscillator formed of a container for an oscillation circuit according to still another embodiment of the present invention.
Figure 10:
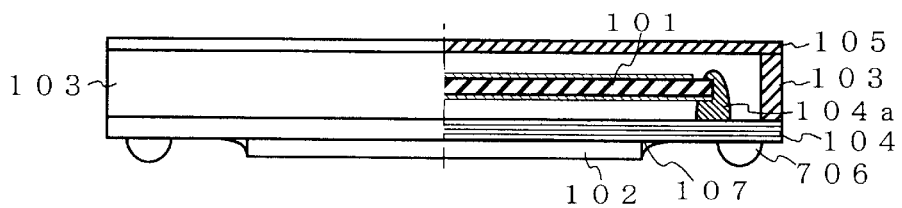
FIG. 10 is a partial sectional view showing an arrangement of an oscillator formed of a container for an oscillation circuit according to still another embodiment of the present invention.

In the above description, the semiconductor component 102 is flip-chip mounted on the lower surface of the substrate 104. At this time, as shown in FIGS. 9 and 10, the periphery of the semiconductor component 102 may be covered with a synthetic resin filler 107.

Figure 13A:
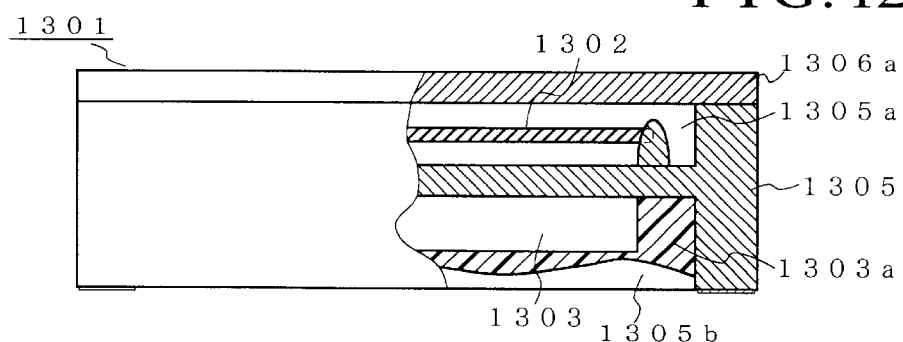
FIG. 13 shows partial sectional views each illustrating an arrangement of a conventional oscillator.
Figure 13B:
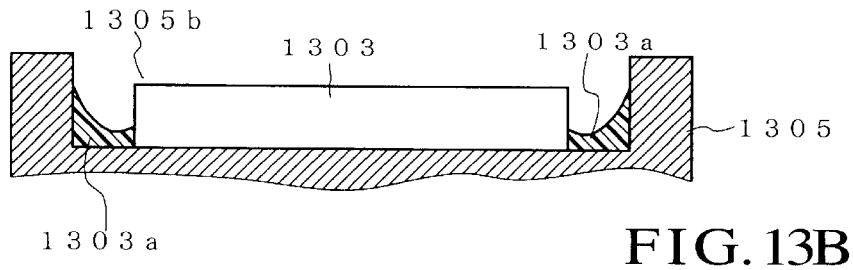
Figure 14:
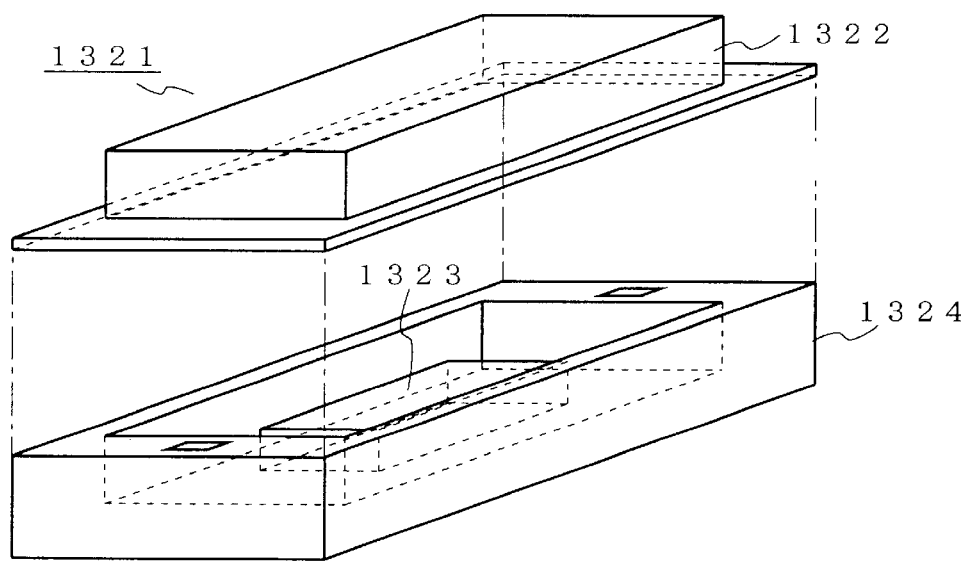
FIG. 14 is a perspective view showing the arrangement of another conventional oscillator.

In the conventional arrangement shown in FIGS. 13*a* and 13*b*, heat produced by soldering for mounting the oscillator 1301 on the circuit mounting substrate tends to be conducted to the electronic component 1303 through the container 1305 and filler 1303*a* to sometimes damage the filler 1303*a* and electronic component 1303. In contrast to this, according to this embodiment, heat produced by soldering is conducted from the electrodes 106 to the semiconductor component 102 through the substrate 104 (FIG. 1*a*). Thus, heat produced by soldering is not easily conducted to the semiconductor component 102, and damage of the semiconductor component 102 can be greatly suppressed. As shown in FIGS. 9 and 10, when the semiconductor component 102 is covered with the filler 107, heat produced during soldering the electrodes 106 and bumps 706 is not easily conducted to the semiconductor component 102. Since the semiconductor component 102 is exposed to the outer air, heat does not stay but can be dissipated easily.

<Second Embodiment>

Another embodiment of the present invention will be described.

Figure 11:
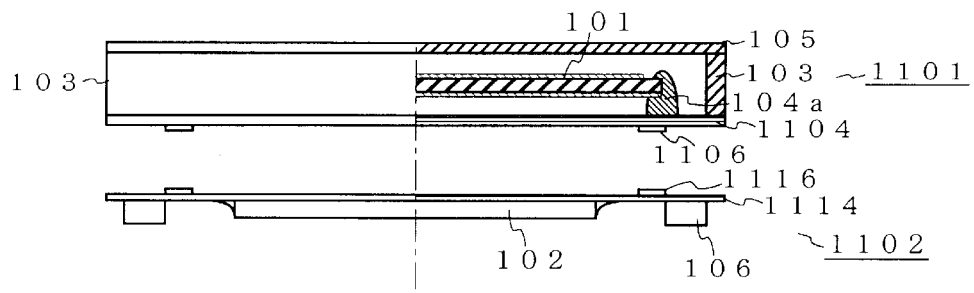
FIG. 11 is a partial sectional view showing the arrangement of an oscillator formed of a container for an oscillation circuit according to still another embodiment of the present invention.

According to this embodiment, as shown in FIG. 11, in a hermetically sealed container constituted by a lid 105, frame 103, and substrate 1104, a piezoelectric vibrator 101 is fixed on the substrate 1104 with fixing members 1104*a* made of a conductive material, thereby forming a vibrator unit 1101. For example, the frame 103 and substrate 1104, and the frame 103 and lid 105 are sealed with each other by an adhering method using a synthetic rubber-based adhesive, glass frit, soldering, seaming, or the like. The fixing members 1104*a* may be formed of a solder, conductive adhesive, or the like.

A circuit interconnection (not shown) is formed on the substrate 1104. The fixing members 1104*a* are formed at predetermined portions of the circuit interconnection. The piezoelectric vibrator 101 is connected to the circuit interconnection through the fixing members 1104*a*. Terminals 1106 are formed on the lower surface of the substrate 1104 such that they extend through the substrate 1104 to connect the circuit interconnection.

In this embodiment, another substrate 1114 is provided. A semiconductor component 102 is flip-chip mounted on a circuit interconnection (not shown) formed on the surface of the substrate 1114. Electrodes 106 are formed at predetermined portions of this circuit interconnection. The substrate 1114, semiconductor component 102, and electrodes 106 constitute a semiconductor component unit 1102. Terminals 1116 are formed on the other surface of the substrate 1114 such that they extend through the substrate 1114 to connect the circuit interconnection.

With the above arrangement, in this embodiment, the terminals 1106 and terminals 1116 are brought into contact with each other so they are connected to each other. The vibrator unit 1101 and semiconductor component unit 1102 are combined to constitute an oscillator. In this case, several vibrator units 1101 and semiconductor component units 1102 may be manufactured, and among them only non-defective ones may be combined to form one oscillator. As a result, the manufacturing cost of the oscillator can be suppressed greatly.

Figure 12:
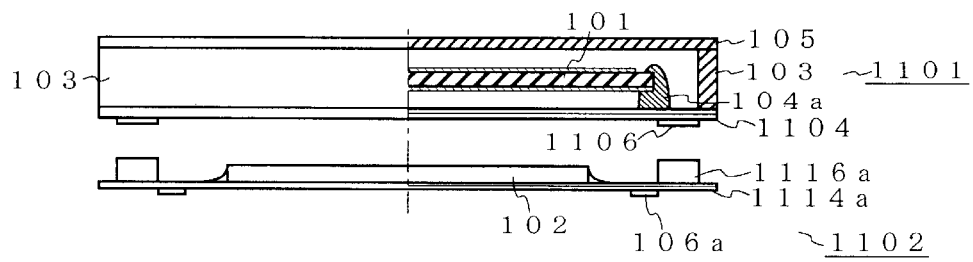
FIG. 12 is a partial sectional view showing the arrangement of an oscillator formed of a container for an oscillation circuit according to still another embodiment of the present invention.

In the above embodiment, the semiconductor component 102 faces that surface of a circuit mounting substrate, which the oscillator is to be mounted. Alternatively, with the arrangement as shown in FIG. 12, the semiconductor component 102 does not face the surface of the circuit mounting substrate. In FIG. 12, the vibrator unit 1101 is completely identical to that shown in FIG. 11.

With the arrangement of FIG. 12, terminals 1116*a* are formed on that surface of a substrate 1114*a*, which a semiconductor component 102 is to be mounted, such that they are higher than the surface of the semiconductor component 102. The terminals 1106 and terminals 1116*a* are connected to each other, thereby forming an oscillator. Electrodes 106*a* for mounting on the circuit mounting substrate are formed on the lower surface of the substrate 1114*a*. In this case, the electrodes 106*a* need not be thick, unlike the electrodes 106.

<Third Embodiment>

The third embodiment of the present invention will be described.

Conventionally, as shown in FIG. 13*a*, the container 1305 integrally formed with the two accommodating portions 1305*a* and 1305*b* on its upper and lower surfaces is used for an oscillator with a temperature compensation function. This container is formed by fixing frames to the upper and lower surfaces of a plate member (substrate). The frames and plate member (substrate) are formed of a ceramic material.

Figure 15A:
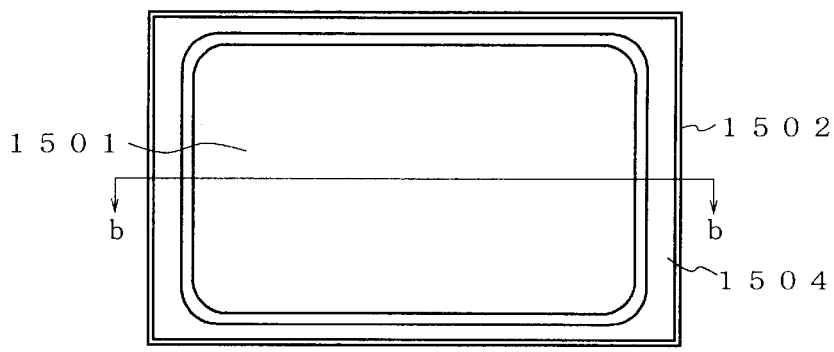
FIG. 15 shows plan views and a sectional view of the arrangement of a container for an oscillation circuit according to still another embodiment of the present invention.
Figure 15B:
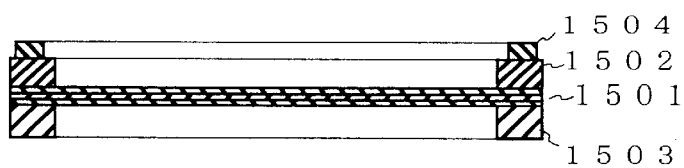
Figure 15C:
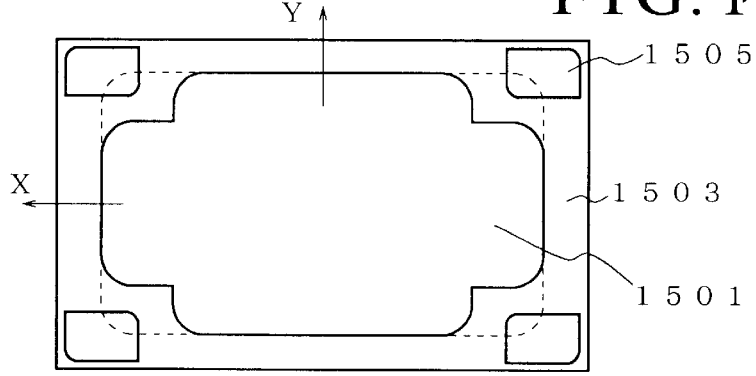

For example, powder of a metal oxide such as aluminum oxide is dispersed in a solvent in which an appropriate binder is dissolved, thereby making the slurry. The dried slurry is machined into desired shapes to form frames 1502, 1503, and 1504, as shown in FIGS. 15*a* to 15*c*. In this state, the material of the frames has not yet become a ceramic material.

Meanwhile, a multilayered substrate 1501 with a multilayered interconnection structure and formed of a ceramic base is prepared.

After that, the frames 1502 and 1503 are arranged on the upper and lower surfaces of the multilayered substrate 1501 such that each end face of the multilayered substrate 1501 and the corresponding side surfaces of the respective frames substantially form one plane. The upper frame 1504 is placed on the frame 1502. The resultant structure is baked at a high temperature, thereby forming a container made of a ceramic material.

Figure 15D:
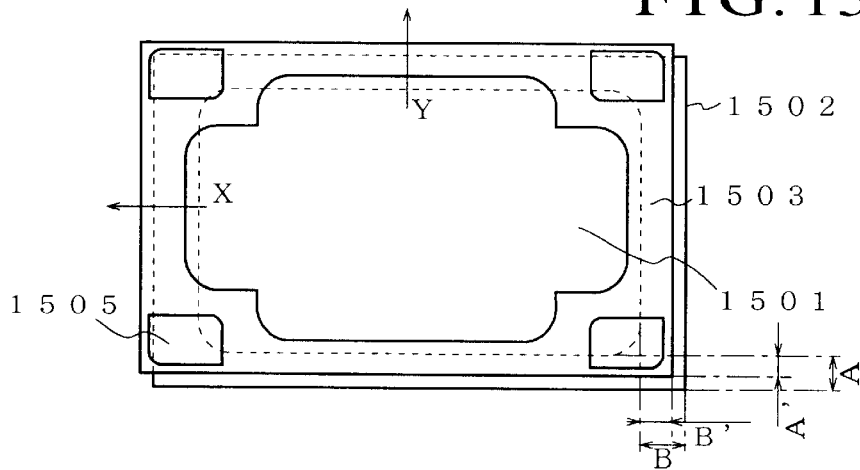

In this container, a piezoelectric vibrator is accommodated in a recessed space defined by the multilayered substrate 1501 and frames 1502 and 1502, and a semiconductor component is accommodated in a recessed space defined by the multilayered substrate 1501 and frame 1503. FIGS. 15*a*, 15*c*, and 15*d* are plan views, and FIG. 15*b* is a sectional view. FIG. 15a shows a state seen from above, and FIGS. 15c and 15d show a state seen from below.

As shown in FIG. 15d, if the multilayered substrate 1501 and the frame 1503 before baking are shifted from each other and accordingly the side surface of the frame 1503 is located at a position shifted from the end of the substrate, the state of the contact surfaces of the frame 1503 and multilayered substrate 1501 becomes nonuniform with respect to the substrate as the center.

For example, the contact area between the multilayered substrate 1501 and frame 1503 on one side portion of the frame 1503 and the contact area between the multilayered substrate 1501 and frame 1503 on an opposite side portion differ from each other.

In the state shown in FIG. 15d, in the left and upper portions, the entire region of the bottom surface of the frame 1503 is in contact with the multilayered substrate 1501. In contrast to this, in the right and lower portions, part of the bottom surface of the frame 1503 is exposed to the right and downward from the end of the multilayered substrate 1501, and the entire region of the bottom surface of the frame 1503 is not in contact with the multilayered substrate 1501.

In this manner, in the nonuniform state, a nonuniform stress is generated at respective portions when the container is to be subjected to baking to form a ceramic integral structure, and the container formation precision may become nonuniform. When a nonuniform stress is applied to the substrate, sometimes the substrate is not formed flat.

In particular, when the longitudinal size of the container is as small as about 4 mm, if A'/A and B'/B in FIG. 15d become smaller than 0.6, the resultant container is not appropriate for accommodating a piezoelectric vibrator. For example, when the longitudinal size of the container is about 4 mm, the width of the frame is about 0.5 mm. In this case, if A'/A and B'/B become smaller than 0.6, the length with which the frame and substrate are in contact with each other in the widthwise direction of the frame becomes smaller than 0.3 mm, which is very narrow.

In this manner, when the container is small, if the frame and substrate are shifted from each other in the widthwise direction of the frame by as small as about 0.2 mm, this shift appears as a shift of as large as 40% as a whole. Then, an influence caused by the stress generated by baking cannot be neglected. For example, the stress generated by baking sometimes forms a region where the frame and substrate are not in tight contact with each other. In this case, the seal of the container cannot be maintained.

Conventionally, as shown in FIG. 15b, the vertical and horizontal sizes located particularly on the inner walls of the recesses of many substrates that are multilayered do not exist on the same line. Thus, a formation error may occur depending on the difference in molding force applied by pressurization and heating. In order to solve this, those portions corresponding to the vertical and horizontal sizes of the inner walls of the recesses may be located on the same line among all the substrates constituting the interlevel container, and a size difference in the vertical and horizontal sizes of the inner walls of the recesses among the respective levels after molding may be set within 0.2 mm. The vertical size of the inner wall of a recess is the size of a portion in FIG. 15c where an arrow denoted by "Y" is placed. The horizontal size of the inner wall of a recess is the size of a portion in FIG. 15c where an arrow denoted by "X" is placed.

Therefore, A'/A and B'/B shown in FIG. 15d are preferably 0.6.or more. In other words, it suffices if the shift amount between the substrate and frame in the widthwise direction of the frame is less than 40% the width of the frame. The length by which the frame is exposed from the substrate in the widthwise direction of the frame is preferably within 0.2 mm.

Figure 16A:
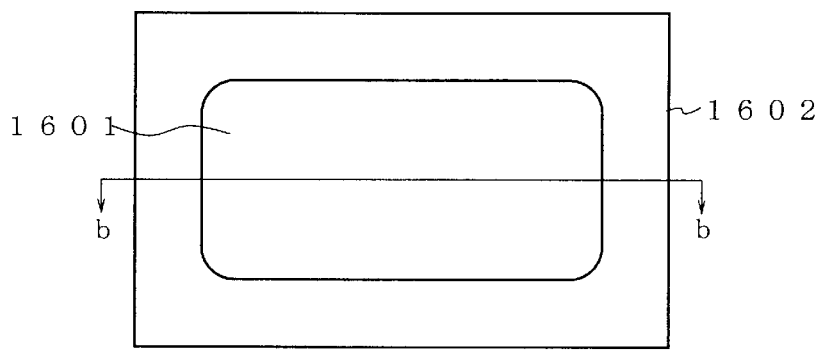
FIG. 16 shows plan views and a sectional view of the arrangement of a container for an oscillation circuit according to still another embodiment of the present invention.
Figure 16B:
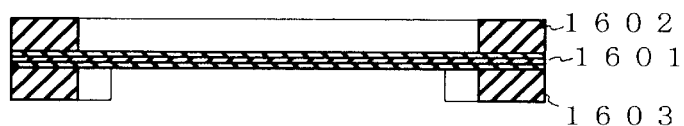
Figure 16C:
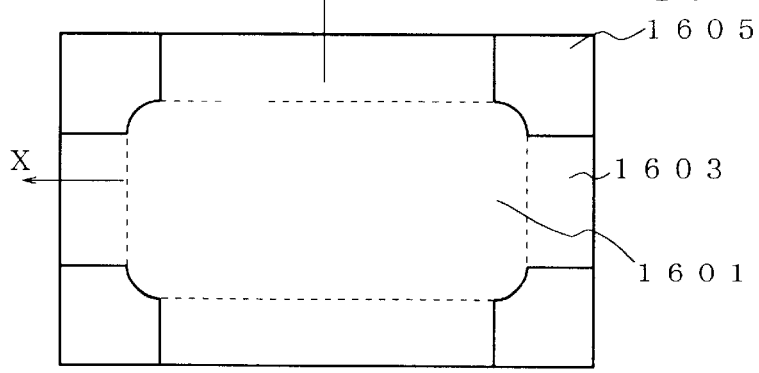

The above description also applies to a container shown in FIGS. 16a to 16c. The container shown in FIGS. 16a to 16c is manufactured in the following manner. First, the above material that will become a ceramic material is machined to form a frame 1602 and pedestal portions 1605. In this state, the material of the frame 1602 and pedestal portions 1605 has not yet become a ceramic material. Meanwhile, a multilayered substrate 1601 with a multilayered interconnection structure and made of a ceramic base is prepared.

After that, the frame 1602 is placed on the upper surface of the multilayered substrate 1601, and the pedestal portions 1605 are placed at four corners on the lower surface of the multilayered substrate 1601. The resultant structure is baked at a high temperature, thereby obtaining a container structure with the four pedestal portions 1605, as shown in FIGS. 16a to 16c.

Figure 16D:
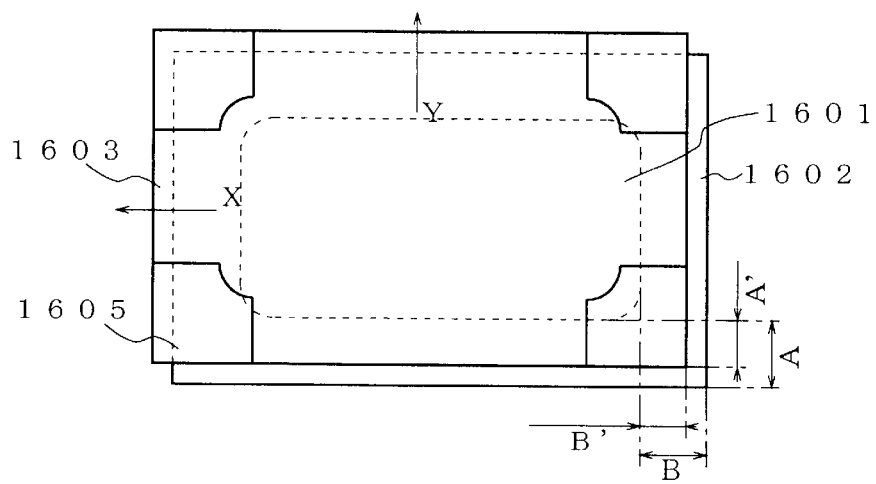

In this container, a piezoelectric vibrator is accommodated in a recessed space defined by the multilayered substrate 1601 and frame 1602, and a semiconductor component is accommodated in a space on the lower surface of the multilayered substrate 1601 which is surrounded by the four pedestal portions 1605. FIGS. 16a, 16c, and 16d are plan views, and FIG. 16b is a sectional view. FIG. 16a shows a state seen from above, and FIGS. 16c and 16d show a state seen from below.

In the container structure of FIGS. 16a to 16c, as shown in FIG. 16d, if the multilayered substrate 1601 and the frame 1602 before baking are shifted from each other and accordingly the frame 1602 is located at a position shifted from the end of the substrate, the state of the contact surfaces of the frame 1602 and substrate 1601 becomes nonuniform with respect to the substrate as the center. In this state, as described above, the formation precision of the container cannot be maintained.

Therefore, in the container structure in the FIGS. 16a to 16c, A'/A and B'/B shown in FIG. 16d are preferably 0.6 or more. In other words, it suffices if the shift amount between the substrate and frame in the widthwise direction of the frame is less than 40% the width of the frame. The length by which the frame is exposed from the substrate in the widthwise direction of the frame is preferably within 0.2 mm.

If the rectangular region of the lower surface of the multilayered substrate 1601 which is in contact with the inner sides of the four pedestal portions 1605 is largely different from the inner region of the frame 1602 in terms of positions and areas, this difference causes a stress during baking. If the pedestal portions 1605 are arranged inside away from the four corners of the multilayered substrate 1601, the region where the semiconductor component can be placed becomes narrow.

Therefore, in the container of FIGS. 16a to 16c, the rectangular region inscribed to the four pedestal portions 1605 is preferably formed to substantially coincide with a region inside the frame 1602 in terms of positions and areas. In other words, it suffices if the positions of the four sides of a rectangle inscribed to the four pedestal portions 1605 are identical to the four inner sides of the frame 1602 that are projected toward the multilayered substrate 1601, or if the shift amounts between these four sides and the projecting positions are within 2 mm.

Then, the vertical and horizontal sizes of the four corners of the inner wall of the frame 1602 and the inner sizes of the respective corners of the pedestal portions 1605 placed on the lower surface of the multilayered substrate 1601 are located on the same lines.

The pedestal portions 1605 are preferably placed on the lower surface of the multilayered substrate 1601 to be as close as possible to its four corners.

INDUSTRIAL APPLICABILITY

As has been described above, according to the present invention, a semiconductor component in which a temperature compensation circuit, temperature detection circuit, and the like are integrated is mounted without being accommodated in a container. Therefore, the present invention is suitable for downsizing an oscillator to be smaller than in the prior art or for manufacturing such an oscillator at a lower cost than in the prior art.

What is claimed is:

1. In a laminated container comprised of at least two multilevel structure substrates, in which at least one of multilevel laminated substrates with recesses, on an upper and bottom surfaces thereof, at portions where an electronic component and a piezoelectric component are to be mounted, employs an annular laminated substrate, said annular laminated substrate is in contact with at least one flat laminated substrate which constitutes said laminated container, and one layer which opposes said flat laminated substrate in contact therewith is said annular laminated substrate, a container for an oscillation circuit using a piezoelectric vibrator, characterized in that portions corresponding to vertical and horizontal sizes of an inner wall of said recess constituting said laminated container and a portion corresponding to a vertical size of an inner wall of the other annular recess are located on the same line by not less than 60%.

2. In a laminated container comprised of at least two multilevel laminated substrates, in which one of said multilevel laminated substrates employs an annular laminated substrate so as to form a recess at a portion thereof where an electronic component and a piezoelectric component are to be mounted, said annular laminated substrate is in contact with at least one flat laminated substrate constituting said laminated container, and at least one layer which is in contact with said flat laminated structure is a laminated substrate with pedestal portions arranged at corners thereof, a container for an oscillation circuit using a piezoelectric vibrator, characterized in that vertical and horizontal sizes of four corners of an inner wall of said annular recess constituting said laminated container and an inner size of each corner portion of the other pedestal portion of said flat laminated substrate are located on the same line.

3. A method of manufacturing a container for a surface-mounted oscillation circuit using a piezoelectric vibrator, characterized by comprising, in order to form a pedestal portion with a sufficiently large thickness an a surface of a substrate where a piezoelectric component is to be mounted, which opposes a side where said piezoelectric component is mounted, the steps of arranging a conductive pedestal portion mask, printing a conductive pedestal portion through said conductive pedestal portion mask, and heating said conductive pedestal portion.

4. A method of manufacturing a container for an oscillation circuit using a piezoelectric vibrator according to claim 3, wherein an electronic component is mounted on that surface of said container for an oscillation circuit which opposes a surface where said piezoelectric component is mounted, thereby forming an oscillator.

5. A container for an oscillation circuit using a piezoelectric vibrator, comprising a hermetically sealable container arranged on a top surface of a substrate wherein heat generated by said semiconductor component is effectively radiated, and adapted to accommodate a piezoelectric vibrator, a plurality of electrode structures arranged on a bottom surface of said substrate and protrude further than a semiconductor component to be flip-chip mounted on said bottom surface of said substrate, wherein said piezoelectric vibrator, said semiconductor component, and said electrode structures constitute an oscillation circuit; and wherein four electrode structures are arranged on said bottom surface of said substrate.

6. A container according to claim 5, wherein said container is constituted by a frame formed on said top surface of said substrate and a lid formed on said frame.

7. A container for an oscillation circuit using a piezoelectric vibrator according to claim 6, wherein said substrate has a multilayered interconnection structure.

8. A container according to claim 5, wherein said container is constituted by a recess formed in said top surface of said substrate and a lid covering said recess.

9. A container for an oscillation circuit using a piezoelectric vibrator, comprising a hermetically sealable container arranged on a top surface of a substrate and adapted to accommodate a piezoelectric vibrator, a plurality of electrode structures arranged on a bottom surface of said substrate and protrude further than a semiconductor component to be flip-chip mounted on said bottom surface of said substrate, wherein heat generated by said semiconductor component is effectively radiated, wherein said piezoelectric vibrator, said semiconductor component, and said electrode structures constitute an oscillation circuit; and wherein three electrode structures are arranged on said bottom surface of said substrate.

10. In a container for an oscillation circuit using a piezoelectric vibrator according to claim 9, an oscillation circuit element using a piezoelectric vibrator, characterized in that said electrode structures are arranged in contact with any ones of four corners of said bottom surface of said substrate.

11. A container for an oscillation circuit using a piezoelectric vibrator, comprising a hermetically sealable container arranged on a top surface of a substrate and adapted to accommodate a piezoelectric vibrator, a plurality of electrode structures arranged on a bottom surface of said substrate and protrude further than a semiconductor component to be flip-chip mounted on said bottom surface of said substrate, wherein heat generated by said semiconductor component is effectively radiated, wherein said piezoelectric vibrator, said semiconductor component, and said electrode structures constitute an oscillation circuit, and wherein said electrode structures are arranged in contact with corners of said substrate, and a side surface of some of said electrode structures and a side surface of part of said substrate substantially forms one plane.

12. A container for an oscillation circuit using a piezoelectric vibrator, comprising a hermetically sealable container arranged on a top surface of a substrate and adapted to accommodate a piezoelectric vibrator, a plurality of electrode structures arranged on a bottom surface of said substrate and protrude further than a semiconductor component to be flip-chip mounted on said bottom surface of said substrate, wherein heat generated by said semiconductor component is effectively radiated, wherein said piezoelectric vibrator, said semiconductor component, and said electrode structures constitute an oscillation circuit; and wherein said substrate is formed of a first substrate where said container is to be formed, and a second substrate where said semiconductor component is mounted.

13. A container for an oscillation circuit using a piezoelectric vibrator, comprising a hermetically sealable container arranged on a top surface of a substrate and adapted to accommodate a piezoelectric vibrator, a plurality of electrode structures arranged on a bottom surface of said substrate and protrude further than a semiconductor component to be flip-chip mounted on said bottom surface of said substrate, wherein heat generated by said semiconductor component is effectively radiated, wherein said piezoelectric vibrator, said semiconductor component, and said electrode structures constitute an oscillation circuit; and wherein said semiconductor component performs temperature compensation of an oscillation frequency obtained by said piezoelectric vibrator.

14. A container for an oscillation circuit using a piezoelectric vibrator according to claim 13, characterized by comprising a plurality of pads formed on a side surface of said substrate and connected to said semiconductor component.

15. A container for an oscillation circuit using a piezoelectric vibrator according to claim 14, characterized in that said semiconductor component has programmable storage means for storing temperature compensation data used for performing temperature compensation, and said plurality of pads are used to rewrite temperature compensation data stored in said storage means.

16. An oscillator comprising, a piezoelectric vibrator arranged on a top surface of a substrate to be disconnected from an outer air, a semiconductor substrate flip-chip mounted on a bottom surface of said substrate, and a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit; and wherein four electrode structures are arranged on said bottom surface of said substrate.

17. An oscillator according to claim 16, wherein said container is constituted by a frame formed on said top surface of said substrate and a lid formed on said frame.

18. An oscillator according to claim 17, wherein said substrate has a multilayered interconnection structure.

19. An oscillator according to claim 16, wherein said container is constituted by a recess formed on said top surface of said substrate and a lid covering said recess.

20. An oscillator comprising a piezoelectric vibrator arranged on a top surface of a substrate to be disconnected from an outer air, a semiconductor substrate flip-chip mounted on a bottom surface of said substrate, and a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit; and wherein three electrode structures are arranged on said bottom surface of said substrate.

21. In an oscillator according to claim 20, an oscillation circuit element using a piezoelectric vibrator, characterized in that said electrode structures are arranged in contact with any ones of four corners of said lower surface of said substrate, and said semiconductor component is arranged in contact with that corner of said lower surface of said substrate, which said electrode structures are not arranged.

22. An oscillator comprising a piezoelectric vibrator arranged on a top surface of a substrate to be disconnected from an outer air, a semiconductor substrate flip-chip mounted on a bottom surface of said substrate, and a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit, wherein said electrode structures are arranged in contact with corners of said substrate, and a side surface of some of said electrode structures and a side surface of part of said substrate substantially form one plane.

23. An oscillator comprising a piezoelectric vibrator arranged on a top surface of a substrate to be disconnected from an outer air, a semiconductor substrate flip-chip mounted on a bottom surface of said substrate, and a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit; and wherein said substrate is formed of a first substrate where said container is to be formed, and a second substrate where said semiconductor component is mounted.

24. An oscillator comprising, a piezoelectric vibrator arranged on a top surface of a substrate to be disconnected from an outer air, a semiconductor substrate flip-chip mounted on a bottom surface of said substrate, and a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit; and wherein said semiconductor component performs temperature compensation of an oscillation frequency obtained by said piezoelectric vibrator.

25. An oscillator according to claim 24, characterized by comprising a plurality of pads formed on a side surface of said substrate and connected to said semiconductor component.

26. An oscillator according to claim 25, characterized in that said semiconductor component has programmable storage means for storing temperature compensation data used for performing temperature compensation, and said plurality of pads are used to rewrite temperature compensation data stored in said storage means.

27. A container for an oscillation circuit using a piezoelectric vibrator, comprising a hermetically sealable container arranged on a top surface of a substrate and adapted to accommodate a piezoelectric vibrator, a plurality of electrode structures arranged on a bottom surface of said substrate and protrude further than a semiconductor component to be flip-chip mounted on said bottom surface of said substrate, wherein heat generated by said semiconductor component is effectively radiated, wherein said piezoelectric vibrator, said semiconductor component, and said electrode structures constitute an oscillation circuit; and wherein said electrode structures are made of a conductive material.

28. A container for an oscillation circuit using a piezoelectric vibrator according to claim 27, characterized in that said electrode structures are made of a metal.

29. A container for an oscillation circuit using a piezoelectric vibrator according to claim 28, characterized in that said electrode structures are soldered to said lower surface of said substrate.

30. An oscillator according to claim 29, characterized in that said electrode structures are made of a metal.

31. An oscillator according to claim 30, characterized in that said electrode structures are soldered to said lower surface of said substrate.

32. An oscillator according to claim 29, characterized in that said electrode structures are made of a metal formed by plating.

33. A container for an oscillation circuit using a piezoelectric vibrator according to claim 27, characterized in that said electrode structures are made of a metal formed by plating.

34. An oscillator comprising, a piezoelectric vibrator arranged on a top surface of a substrate to be disconnected from an outer air, a semiconductor substrate flip-chip mounted on a bottom surface of said substrate, a plurality of electrode structures arranged on said bottom surface of said substrate and protrude further than said semiconductor component, wherein heat generated by said semiconductor component is effectively radiated, wherein said piezoelectric vibrator, said semiconductor component, and said electrode structures constitute an oscillation circuit, and wherein said electrode structures are made of a conductive material.

35. A container for an oscillation circuit using an oscillator, characterized by comprising a hermetically sealable container arranged on a major surface of a substrate and adapted to accommodate a piezoelectric vibrator, and a frame stacked on a lower surface of said substrate and higher than a semiconductor component to be flip-chip mounted on said lower surface of said substrate, wherein a shift amount between said substrate and said frame in a widthwise direction of said frame is less than 40% a width of said frame, and said piezoelectric vibrator and said semiconductor component constitute said oscillation circuit.

36. A container for an oscillation circuit using a piezoelectric vibrator according to claim 35, wherein said frame is exposed from said substrate in a widthwise direction of said frame by a length within 0.2 mm.

37. A container for an oscillation circuit using a piezoelectric vibrator, characterized by comprising a hermetically sealable container arranged on a major surface of a substrate and adapted to accommodate a piezoelectric vibrator, and four pedestal portions arranged in contact with four corners of a lower surface of said substrate and higher than a semiconductor component to be flip-chip mounted on said lower surface of said substrate, wherein a shift amount between said substrate and said frame in a widthwise direction of said frame is less than 40% a width of said frame, positions of four sides of a rectangle inscribed to said four pedestal portions overlap positions where four inner sides of said frame are projected toward said substrate, and said piezoelectric vibrator and said semiconductor component constitute an oscillation circuit.

38. A container for an oscillation circuit using a piezoelectric vibrator, characterized by comprising a hermetically sealable container arranged on a major surface of a substrate and adapted to accommodate a piezoelectric vibrator, and four pedestal portions arranged in contact with four corners of a lower surface of said substrate and higher than a semiconductor component to be flip-chip mounted on a lower surface of said substrate, wherein a shift amount between said substrate and said frame in a widthwise direction of said frame is less than 40% a width of said frame, positions of four sides of a rectangle inscribed to said four pedestal portions overlap positions where four inner sides of said frame are projected toward said substrate within a region of 2 mm, and said piezoelectric vibrator and said semiconductor component constitute an oscillation circuit.

* * * * *